United States Patent [19]
Reinert

[11] 4,099,070
[45] Jul. 4, 1978

[54] SENSE-WRITE CIRCUIT FOR RANDOM ACCESS MEMORY

[75] Inventor: John R. Reinert, Mesa, Ariz.

[73] Assignee: Motorola, Inc., Schaumburg, Ill.

[21] Appl. No.: 745,021

[22] Filed: Nov. 26, 1976

[51] Int. Cl.² .................. G11C 7/00; G11C 11/40; H03K 3/286; H03K 3/353

[52] U.S. Cl. .................. 307/238; 307/291; 307/350; 307/DIG. 3; 365/155; 365/189; 365/208

[58] Field of Search ........ 307/238, 270, 350, 362–364, 307/DIG. 1, DIG. 3, DIG. 5; 340/173 R, 173 FF

[56] References Cited

U.S. PATENT DOCUMENTS

| | | | |
|---|---|---|---|
| 3,538,348 | 11/1970 | Hillis et al. | 307/238 |
| 3,676,704 | 7/1972 | Donofrio et al. | 307/355 |
| 3,700,915 | 10/1972 | Marley | 307/215 |
| 3,713,115 | 1/1973 | Duben | 307/238 X |
| 3,736,574 | 5/1973 | Gersbach | 307/238 X |
| 3,919,566 | 11/1975 | Millhollan et al. | 307/238 X |

OTHER PUBLICATIONS

Davis et al., "Associative–Memory System Using Latchable Search Drivers," IBM Tech. Discl. Bull.; vol. 15, No. 3, pp. 719–720; 8/1972.

*Primary Examiner*—Larry N. Anagnos
*Attorney, Agent, or Firm*—Anthony J. Sarli, Jr.

[57] ABSTRACT

A sense-write circuit for use with a emitter coupled logic memory array is provided. A first differential stage includes a pair of emitter-coupled transistors connected to a current source controlled by a chip select voltage. A first one of the emitter-coupled transistors has its base connected to a first reference voltage and the second one of said transistors has its base coupled to a write enable input. The collector of a first one of the emitter-coupled transistors serves as a current source for a second differential stage including a second pair of emitter-coupled transistors, a first one having its base connected to a second reference voltage and the second having its base coupled to a data input conductor. The two respective outputs of the second differential stage are coupled to emitter follower drivers, and are also independently coupled through a pair of respective diode-connected transistors to the collector of the first transistor of the first emitter coupled pair.

13 Claims, 1 Drawing Figure

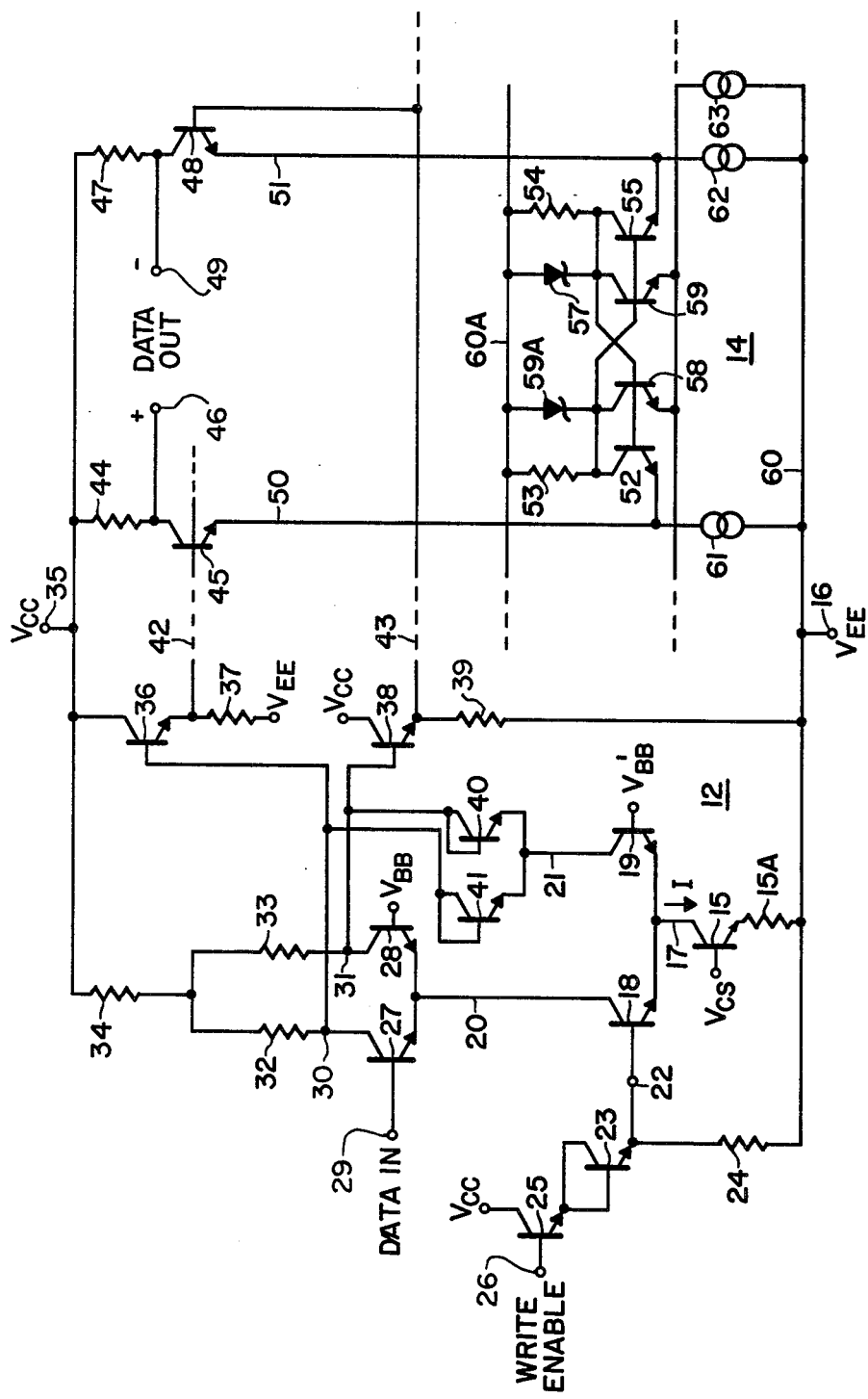

SENSE-WRITE CIRCUIT FOR RANDOM ACCESS MEMORY

BACKGROUND OF THE INVENTION

1. Field of the Invention

The invention relates to improvements in sense-write circuits for random access memories.

2. Brief Description of the Prior Art

A variety of sense-write circuits for ECL (emitter-coupled logic) memory arrays are known in the art. One example of such a circuit is described in U.S. Pat. No. 3,919,566, and typical decoding circuitry for an ECL memory array is described in U.S. Pat. No. 3,914,620, both by Millhollan, et al and both assigned to the present assignee. Both of the above patents are incorporated herein by reference. The known ECL sense-write circuits utilize two differential stages, one for establishing a sense voltage on a bit sense line of the memory array, and the other operating to establish the Write-Data and Write-Data voltages on the bit-sense lines during write operations. Separate current sources are required for each of the differential stages. The topology in integrated circuit layout for multiple differential stages does not optimize use of chip area. Needlessly complex interface circuitry between the differential stages and the bit-sense lines in the memory array is required.

SUMMARY OF THE INVENTION

It is an object of the invention to provide a sense-write circuit utilizing differential stages in a tree configuration such that only one current source is required.

Another object of the invention is to provide a sense-write buffer for a memory array and requiring a minimum number of components in construction and a minimum of interconnection of components.

Briefly described, the invention is a sense-write circuit including first and second transistors having their emitters coupled to a first current source. Third and fourth transistors are provided having their emitters coupled to the collector of the first transistor. The base of the first transistor is coupled to a write signal, and the base of the third transistor is coupled to a data input signal. First and second rectifying devices are coupled between the respective collectors of the third and fourth transistors and the collector of the second transistor. The collectors of the third and fourth transistors are coupled by means of buffering and amplifying circuitry to a pair of bit sense lines of a storage cell.

BRIEF DESCRIPTION OF THE DRAWING

The sole FIGURE is a schematic drawing of a preferred embodiment of the invention.

DESCRIPTION OF THE INVENTION

Referring to the FIGURE, it is seen that sense-write buffer 12 includes transistor 15 having its emitter coupled to a $V_{EE}$ voltage supply conductor 16 through a resistor 15A, its base connected to a conductor $V_{CS}$ (chip select), and its collector connected to node 17. Resistor 15A determines the current through transistor 15 for a given voltage applied to $V_{CS}$. Transistors 18 and 19 have their emitters connected to node 17. Transistor 18 has its base connected to node 22, which is connected to the emitter of transistor 23 and to one terminal of resistor 24, which has its other terminal connected to $V_{EE}$. Transistor 23 has its base and collector connected to the emitter of transistor 25, which has its collector connected to $V_{CC}$ and its base connected to write enable input 26. Transistor 18 has its collector connected to node 20. Transistors 27 and 28 have their emitters connected to node 20. Transistor 27 has its base connected to Data-In input 29 and its collector connected to node 30, which is connected to one terminal of resistor 32. The other terminal of resistor 32 is connected to one end of resistor 34, the other end of which is connected to $V_{CC}$ conductor 35. Transistor 28 has its base connected to first reference voltage $V_{BB}$. The collector of transistor 28 is connected to node 31, which is also connected to one end of resistor 33, the other terminal of which is connected to resistor 34. Transistor 19 has its base connected to second reference voltage $V_{BB'}$. Typical values of the supply voltages and reference voltages are $V_{CC} = 0$ volts, $V_{EE} = -5.2$ volts, $V_{BB} = -1.3$ volts, $V_{BB'} = -2.9$ volts. Typically, $V_{BB}$ and $V_{BB'}$ and $V_{CS}$ are generated by temperature tracking voltage reference circuits provided on the same integrated circuit chip of the entire memory. Diode-connected transistor 41 has its base and collector connected to node 30 and its emitter connected to node 21, which is also connected to the collector of transistor 19. Diode-connected transistor 40 has its base and collector connected to node 31 and its emitter connected to node 21. Node 30 is connected to the input of an emitter follower including transistors 36 and resistor 37. Node 31 is connected to the base of the input transistor 38 of an emitter follower including transistor 38 and resistor 39. The FIGURE also shows a typical ECL storage cell 14, which includes transistors 52, 58, 59 and 55, and also the resistors 54 and 53 and diodes 57 and 59A. This storage cell is well known and will not be described in further detail. See the above mentioned U.S. Pat. Nos. 3,919,566 and 3,914,620, incorporated herein by reference.

A typical integrated circuit random access memory would include a plurality of storage cells such as 14 arranged in rows and columns. Row selection and column selection circuitry suitable for selecting rows and columns of such a memory are well known and implementable by those skilled in the art. Output 42 of emitter follower 36, 37 is connected to the base of transistor 45 and to a plurality of other transistors in other columns of storage cells corresponding to transistor 45. Similarly, second emitter follower output 43 is connected to the base of transistor 48 and to comparable other transistors.

Sense-write buffer 12 operates in two modes, a write mode and a sensing mode. The voltage $V_{CS}$ will normally be generated by a level translating circuit coupled between the base of transistor 15 and a chip enable input, not shown.

A differential transistor pair 18, 19 is controlled by the write enable input 26. The differential pair 27, 28 is controlled by a Data-In input 29. The outputs on nodes 42 and 43 are given as a function of the write enable and Data-In inputs.

| INPUT | | OUTPUT | |
|---|---|---|---|
| Write Enable | Data In | Node 42 | Node 43 |
| 0 | 0 | Sense-level | Sense-level |
| 0 | 1 | Sense-level | Sense-level |
| 1 | 0 | 1 | 0 |
| 1 | 1 | 0 | 1 |

Typical levels for the above table are sense level = −1.3 volts, "0" = −1.7 volts, and "1" = −0.8 volts.

The memory array storage cell 14 is typical of an ECL storage cell, and the circuits (44, 45) and (47, 48) connected, respectively, to the bit sense lines 50 and 51 are conventional. If nodes 42 and 43 are both at a proper sense voltage, such as −1.3 volts, then it can be recognized that two separate differential amplifiers are formed by means of the transistors 45 and 52 and current source 61 on one side and transistors 48 and 55 and current source 62 on the other side if the storage cell is selected by bringing row selection conductor 60A to −1.0 volts. The collector nodes of a storage cell provide the data inputs to the two differential amplifiers, and the sense levels at nodes 42 and 43 provide the reference voltage for the two differential amplifiers thus formed. The sense voltage of −1.3 volts is designed to be midway between the two collector voltages of a selected storage cell. Therefore, only one of the transistors 45 or 48 will be in the on condition, and the storage cell state is sensed as a voltage difference between resistors 44 and 47 at the data out terminals 46 and 49 during a sensing operation.

During a read operation, the levels of nodes 42 and 43 are established as follows. Write enable input 26 will be low, assuming that the chip is selected, so that transistor 15 is on. Transistor 18 will be off, and current I will flow through transistor 19. Diode-connected transistors 40 and 41 are essentially identical, matched devices, so that the current through them is equally divided. Since no current flows through node 20, transistors 27 and 28 are off, and a current equal to I/2 flows through each of matched resistors 32 and 33. (Resistor 34 can be utilized to provide an offset, if desired.) Therefore, the voltages at nodes 30 and 31 are equal, and consequently the voltages at nodes 42 and 43 are also equal, each being a $V_{BE}$ drop below nodes 30 and 31, respectively.

A write operation occurs when write-enable input 26 is high, so that transistor 18 is on, and transistor 19 is off. Then transistors 40 and 41 are also off, and current "I" flows through transistor 18. Current "I" flows through either transistor 27 or 28, depending on whether Data-In input 29 is high or low. Thus, the switch current "I" flows through either resistor 32 or 33, depending on the voltage of Data-In, at one of nodes 30 or 31, so that one will be relatively low and the other will be relatively high. The voltages on nodes 30 and 31 will be translated through transistors 36 and 38 to nodes 42 and 43, and these voltages will in turn be translated through transistors 45 and 48 to bit-sense lines 50 and 51, respectively, and the logic state represented by these voltages will be written into memory cell 14 if it is selected.

What is claimed is:

1. A sense-write circuit comprising:
   first and second transistors having their emitters coupled together to a first current source means;
   third and fourth transistors having their emitters coupled together to the collector of said first transistor;
   the base of said first transistor being responsive to a write signal, and the base of said third transistor being responsive to a data input signal;
   first and second rectifying means coupled between the collector of said second transistor and the collectors of said third and fourth transistors, respectively; and
   means coupled to the collectors of said third and fourth transistors for writing information into a memory cell from said third and fourth transistors and establishing a pair of reference voltages for effecting reading information out of a memory cell.

2. The sense-write circuit as recited in claim 1 wherein said transistors are NPN transistors.

3. The sense-write circuit as recited in claim 1 wherein said first and second rectifying means are each diode-connected transistors having their emitters coupled to the collector of said second transistor and their collectors and bases connected to the collector of said third transistor and the collector of said fourth transistor, respectively.

4. The sense-write circuit as recited in claim 1 further including first voltage reference means coupled to the base of said second transistor for establishing a reference potential thereat, and further including second voltage reference means coupled to the base of said fourth transistor for establishing a second reference voltage greater than said first reference voltage thereat.

5. The sense-write circuit as recited in claim 4 further including voltage translation means coupled between a write enable input and the base of said first transistor for translating the voltage level of a write enable input to a voltage above or below said first reference voltage, depending on whether said write enable input is at a logical "1" or a logical "0".

6. The sense-write circuit as recited in claim 1 further including first and second emitter followers having inputs coupled, respectively, to said collectors of said third and fourth transistors, respectively.

7. The sense-write circuit as recited in claim 6 further including a fifth transistor having its base coupled to the output of said first emitter follower, its emitter connected to a first bit-sense conductor, and its collector coupled by means of a first resistor to a voltage conductor, and further including a sixth transistor having its emitter coupled to a second bit-sense conductor, its base coupled to the output of said second emitter follower, and its collector coupled by means of a second resistor to said voltage conductor.

8. The sense-write circuit as recited in claim 1 further including a first resistor having one terminal coupled to the collector of said third transistor and its other terminal coupled to a voltage conductor, and further including a second transistor having one terminal coupled to the collector of said fourth transistor and its other terminal coupled to said voltage conductor.

9. The sense-write circuit as recited in claim 8 further including a third resistor coupling said first and second resistors to said voltage conductor.

10. A sense-write circuit for effecting writing information into and reading information out of a memory cell comprising:
    a first pair of differentially coupled transistors responsive to a write signal,
    a second pair of differentially coupled transistors responsive to a data input signal having their emitters coupled to the collector of a first transistor of said first pair of transistors, and
    means coupled to the collectors of said second pair of transistors for writing information into a memory cell from said second pair of transistors and establishing a pair of reference voltages for effecting reading information out of a memory cell.

11. A sense-write circuit as recited in claim 10 further comprising:
    a pair of rectifying means coupled between the collectors of said second pair of transistors and the collector of a second transistor of said first pair of transistors.

12. A sense-write circuit for effecting writing information into and reading information out of a plurality of memory cells comprising:
   a current source having a current of magnitude I,
   first and second load resistors, and
   differential current switching means coupled between said current source and said load resistors, and having terminals for receiving a write signal and a data signal, said differential current switching means providing a current substantially of magnitude I/2 to each of said load resistors for generating a pair of reference voltages for reading when said write signal is at a first logic state, and being responsive to said data signal for providing a current substantially of magnitude I to one of said load resistors for generating first and second data voltages for writing when said write signal is at a second logic state.

13. A sense-write circuit as recited in claim 12 wherein:
   said first data voltage is substantially more positive than said reference voltages and said second data voltage is substantially more negative than said reference voltages.

* * * * *